United States Patent
Currie

(10) Patent No.: US 7,432,139 B2
(45) Date of Patent: Oct. 7, 2008

(54) METHODS FOR FORMING DIELECTRICS AND METAL ELECTRODES

(75) Inventor: Matthew T. Currie, Brookline, MA (US)

(73) Assignee: AmberWave Systems Corp., Salem, NH (US)

( * ) Notice: Subject to any disclaimer, the term of this patent is extended or adjusted under 35 U.S.C. 154(b) by 128 days.

(21) Appl. No.: 11/170,250

(22) Filed: Jun. 29, 2005

(65) Prior Publication Data

US 2007/0004224 A1    Jan. 4, 2007

(51) Int. Cl.
H01L 21/00   (2006.01)

(52) U.S. Cl. .................. 438/164; 438/216; 438/287; 438/162

(58) Field of Classification Search .......... 438/769, 438/770, 775, 778, 197, 162–166
See application file for complete search history.

(56) References Cited

U.S. PATENT DOCUMENTS

| | | | |
|---|---|---|---|
| 4,570,328 A | 2/1986 | Price et al. | |
| 5,786,620 A | 7/1998 | Richards, Jr. et al. | |
| 5,930,632 A | 7/1999 | Gardner et al. | |
| 6,348,420 B1 * | 2/2002 | Raaijmakers et al. | 438/769 |
| 6,423,619 B1 * | 7/2002 | Grant et al. | 438/589 |
| 6,552,388 B2 | 4/2003 | Wilk et al. | |
| 6,621,114 B1 | 9/2003 | Kim et al. | |
| 6,632,729 B1 | 10/2003 | Paton | |
| 6,696,332 B2 | 2/2004 | Visokay et al. | |
| 6,737,716 B1 | 5/2004 | Matsuo et al. | |
| 6,743,473 B1 | 6/2004 | Parkhe et al. | |
| 6,746,905 B1 * | 6/2004 | Fukuda | 438/164 |
| 6,749,687 B1 | 6/2004 | Ferro et al. | |
| 6,756,635 B2 | 6/2004 | Yasuda et al. | |
| 6,770,535 B2 | 8/2004 | Yamada et al. | |
| 6,780,704 B1 | 8/2004 | Raaijmakers et al. | |
| 6,785,120 B1 | 8/2004 | Basceri et al. | |
| 6,846,743 B2 | 1/2005 | Endo et al. | |
| 6,858,524 B2 * | 2/2005 | Haukka et al. | 438/585 |
| 7,023,064 B2 | 4/2006 | Park et al. | |
| 7,084,024 B2 | 8/2006 | Gluschenkov et al. | |
| 7,282,403 B2 | 10/2007 | Park et al. | |
| 2002/0061694 A1 | 5/2002 | Yamada et al. | |
| 2002/0119622 A1 | 8/2002 | Steigerwald et al. | |
| 2003/0025140 A1 * | 2/2003 | Kusters et al. | 257/301 |
| 2003/0030117 A1 | 2/2003 | Iwasaki et al. | |
| 2003/0116804 A1 | 6/2003 | Visokay et al. | |
| 2003/0224600 A1 | 12/2003 | Cao et al. | |

(Continued)

FOREIGN PATENT DOCUMENTS

WO    2004/010471 A2    1/2004

OTHER PUBLICATIONS

International Search Report and Written Opinion for PCT/US2006/024257, dated Nov. 8, 2006.

(Continued)

*Primary Examiner*—Dung A. Le
(74) *Attorney, Agent, or Firm*—Goodwin Procter LLP

(57) ABSTRACT

A method for forming a semiconductor structure, the method including forming in a processing chamber a dielectric layer over a substrate; and subsequently forming, in the same processing chamber and without removing the substrate therefrom, an electrode layer directly over and in contact with the dielectric layer.

29 Claims, 8 Drawing Sheets

U.S. PATENT DOCUMENTS

| | | | |
|---|---|---|---|
| 2003/0235961 | A1 | 12/2003 | Metzner et al. |
| 2004/0012043 | A1 | 1/2004 | Gealey et al. |
| 2004/0017305 | A1 | 1/2004 | Koyama et al. |
| 2004/0036118 | A1 | 2/2004 | Abadeer et al. |
| 2004/0077136 | A1 | 4/2004 | Ma et al. |
| 2004/0104439 | A1 | 6/2004 | Haukka et al. |
| 2004/0113171 | A1 | 6/2004 | Chiu et al. |
| 2004/0180487 | A1 | 9/2004 | Eppich et al. |
| 2004/0183142 | A1 | 9/2004 | Matsuo et al. |
| 2004/0183143 | A1 | 9/2004 | Matsuo |
| 2004/0198069 | A1 | 10/2004 | Metzner et al. |
| 2004/0241947 | A1 | 12/2004 | Wilk et al. |
| 2005/0026458 | A1 | 2/2005 | Basceri et al. |
| 2005/0042373 | A1 | 2/2005 | Kraus et al. |
| 2005/0156256 | A1 | 7/2005 | Kim et al. |
| 2005/0230759 | A1 | 10/2005 | Shimizu et al. |
| 2005/0258500 | A1 | 11/2005 | Colombo et al. |
| 2005/0275035 | A1 | 12/2005 | Mathew et al. |
| 2006/0068575 | A1 | 3/2006 | Gluschenkov et al. |
| 2006/0081947 | A1 | 4/2006 | Mimura |
| 2006/0151823 | A1 | 7/2006 | Govindarajan |
| 2006/0189154 | A1 | 8/2006 | Ahn et al. |
| 2006/0255412 | A1* | 11/2006 | Ramaswamy et al. ....... 257/368 |

OTHER PUBLICATIONS

Koike, et al. "Effect of Hf-N Bond on Properties of Thermally Stable Amorphous HfSION and Applicability of this Material to Sub-50nm Technology Node LSIs" IEEE (2003).

Arranz, "Synthesis of hafnium nitride films by 0.5-5 KeV nitrogen implantation of metallic HF: an X-ray photoelectron spectroscopy and factor analysis study," *Surface Science* 563 1-12 (2004).

Bazhanov et al., "Structure and electronic properties of zirconium and hafnium nitrides and oxynitrides," *97 J. Applied Physics* 044108 (2005).

Gotoh et al., "Formation and Control of Stoichiometric Hafnium Nitride Thin Films by Direct Sputtering of Hafnium Nitride Target," *42 Jpn. J. Applied Physics* (2003).

Gotoh et al., "Measurement of work function of transition metal nitride and carbide thin films," *J. Vac. Sci. Technol. B 21* (4) Jul./Aug. (2003).

Wang et al., "The Fabrication of Hafnium Nitride by Metal Organic Chemical Vapor Deposition (MOCVD) Using TDEAHf Precursor for Gate-Electrode Application," 43 No. 11A *Jpn. J. Applied Physics* (2004).

Wang et al., "A Simple Approach to Fabrication of High-Quality HfSiON Gate Dielectrics With Improved nMOSFET Performances," 51 *IEEE Transactions on Electron Devices* No. 11 Nov. (2004).

Yu et al., "Physical and Electrical Characteristics of HfN Gate Electrode for Advanced MOS Devices," 24 *IEEE Electron Device Letters* No. 4 Apr. (2003).

Yu et al., "Thermally Robust High Quality HfN/HfO$_2$ Gate Stack for Advanced CMOS Devices," *IEEE* (2003).

Yu et al., "Thermally Robust HfN Metal as a Promising Gate Electrode for Advanced MOS Device Applications," 51 *IEEE Transactions on Electron Devices* No. 4 Apr. (2004).

Yu et al., "Robust High-Quality HfN-HfO$_2$ Gate Stack for Advanced MOS Device Applications," 25 *IEEE Transactions on Electron Devices* No. 2 Feb. (2004).

Sell et al., "Interface analysis of atomic layer deposited-TiN gate electrodes on ultrathin SiO$_2$ layers," 21 J. Vac. Sci. Tech. B: Microelectronics & Nanometer Structures 3, pp. 931-935 (2003).

* cited by examiner

METHODS FOR FORMING DIELECTRICS AND METAL ELECTRODES

FIELD OF THE INVENTION

This invention relates to methods and materials for formation of structures including metal electrodes and high-k dielectrics.

BACKGROUND

Dielectric layers and metal electrodes are important for the performance and functionality of microelectronic devices such as transistors and memory capacitors. For example, the gate dielectric layer and gate electrode are vital components that are necessary for the operation of a metal-oxide-semiconductor field-effect transistor (MOSFET). Likewise, a dielectric layer and an inner electrode are needed in a dynamic random-access memory (DRAM) trench capacitor, where they are used for storage of charge and access to the charge stored within the capacitor. The selection of materials and deposition processes for these and other dielectric layers and metal electrodes gains importance as microelectronic design rules shrink in an effort to increase device density and functionality.

MOSFETs have traditionally incorporated silicon dioxide ($SiO_2$) or silicon oxynitride (SiON) materials as gate dielectrics, and heavily doped polysilicon as gate electrodes. However, device scaling is quickly reaching the point where these materials will be inadequate to serve their intended purposes. In an effort to increase gate capacitance (and therefore device speed and performance), the $SiO_2$ or SiON gate dielectric layers have been scaled down to thicknesses of 1-1.5 nm. At these physical thicknesses, carrier tunneling through the gate dielectric can lead to an elevated gate leakage current in the device and high power dissipation in the circuit. Thus, gate dielectric layers with higher capacitance are needed, without a reduction in physical thickness. This requirement necessitates the use of dielectric materials with higher dielectric constants (i.e., permittivities) than that of $SiO_2$ (k=3.9). These high-k materials have dielectric constants higher than 3.9, preferably greater than or equal to 9, and in some instances greater than or equal to 25.

Another motivation for the use of alternative gate dielectric materials is the increasing level of interest in non-traditional (i.e., non-silicon) MOSFET channel materials. Such alternative channel materials may have higher intrinsic carrier mobilities and therefore improve device speed. While $SiO_2$ and SiON form high quality interfaces with silicon (Si), however, this is frequently not the case with alternative channel materials such as germanium (Ge), III-V materials such as gallium arsenide (GaAs), indium gallium arsenide (InGaAs), gallium antimonide (GaSb), gallium nitride (GaN), and indium antimonide (InSb), or II-VI materials such as zinc selenide (ZnSe) or zinc oxide (ZnO). Thus, high-k gate dielectrics are needed not only to decrease gate leakage and increase gate capacitance, but also to form high-quality interfaces with Si or non-silicon channel materials.

Scaling of DRAM trench capacitors also necessitates the use of high-k dielectrics. To store more charge in a particular physical chip area, capacitor surface area (i.e., the trench depth and aspect ratio of depth to width) should be increased, as should the dielectric constant of the capacitor dielectric layer. Thus, a move from $SiO_2$ or SiON to high-k dielectrics is desirable. For this application, these high-k materials have dielectric constants higher than 3.9, preferably greater than or equal to 9, and in some instances greater than or equal to 25.

The replacement of heavily doped polysilicon as an electrode material is also important for future improvements in device performance. As device geometries scale, issues of gate resistance and polysilicon depletion limit the effectiveness of polysilicon as an electrode material. Additionally, many emerging device geometries and concepts (e.g., ultra-thin body MOSFETs, multiple-gate MOSFETs, finFETs, or similar devices) require the use of a mid-gap workfunction gate electrode not achievable with doped polysilicon. The use of a metal electrode material can decrease gate resistance (or likewise inner electrode resistance in a trench capacitor) and eliminate polysilicon depletion. Metal gate electrodes can also have mid-gap workfunctions or near band-edge workfunctions. The metals chosen for such applications should be highly compatible with the dielectric materials with which they will share an interface. A high degree of interdiffusion of atomic species between the dielectric layer and electrode and undesirable reactions between the two materials should be avoided.

SUMMARY

The possibility of combining of non-traditional dielectric materials and metal electrodes is an important tool for developing devices with enhanced performance. Moreover, highly uniform layer thicknesses and compositions are beneficial for the manufacturability and process margin for layers on large-area substrates, particularly when the materials are patterned into multiple devices across the wafer. This capability may be particularly advantageous in the context of the non-planar geometries of a capacitor trench or multiple-gate MOSFET. The materials are preferably fabricated efficiently and economically to reduce defects and increase yield.

A method and materials system are provided for forming metal electrodes in conjunction with dielectric materials, such as high-k dielectrics.

The method enables the formation of the dielectric layer and the electrode layer in the same chamber, thereby, in some embodiments, streamlining the manufacturing process, reducing contamination, and increasing yields. Such fabrication methods may include the use of common deposition chambers, deposition conditions such as temperature or pressure, and/or common precursor materials.

In one aspect, the invention features a method for forming a semiconductor structure, the method including the steps of (i) forming in a processing chamber a dielectric layer over a substrate; and (ii) subsequently forming, in the same processing chamber and without removing the substrate therefrom, an electrode layer directly over and in contact with the dielectric layer.

One or more of the following features may be included. The dielectric layer is a gate dielectric layer and the electrode layer is a gate electrode layer. The gate dielectric layer is formed above a channel region, and the channel region and the gate dielectric layer have at least one element in common. The gate dielectric layer and the channel region are each formed by a first deposition technique. The channel region is formed in the processing chamber and the semiconductor substrate may remain in the processing chamber during the formation of the channel region and the gate dielectric layer. A transistor, such as a finFET, is formed over the substrate.

A trench is defined in the substrate, the dielectric layer is disposed in the trench, and the electrode layer is an inner electrode layer.

The dielectric layer is formed by at least one of atomic layer deposition, chemical vapor deposition, molecular beam epitaxy, and sputtering. The dielectric formation method utilizes a first precursor including at least one of a metal halide, a metal, a metal nitride, and an organometallic compound comprising a metal, with the metal being selected from a group IIIA metal, a transition metal, a rare earth metal, an alkali metal, and an alkaline earth metal.

The processing chamber includes a single-wafer chamber.

Forming the dielectric layer includes forming at least one of a metal oxide and a metal nitride.

The electrode layer is formed by at least one of atomic layer deposition, chemical vapor deposition, molecular beam epitaxy, and sputtering. The electrode formation method utilizes a second precursor including at least one of a metal halide, a metal organometallic compound, a metal, and a metal nitride, and the metal is selected from a group IIIA metal, a transition metal, a rare earth metal, an alkali metal, and an alkaline earth metal.

The electrode layer includes at least one of a metal and a metal nitride.

The dielectric layer and electrode layer are formed by substantially the same formation method, such as by atomic layer deposition. The dielectric layer and the electrode layer are formed from substantially the same precursor, or, alternatively, from different precursors, i.e., include different compositions and/or different concentrations in an ambient.

An interfacial layer is formed between the dielectric layer and the substrate. Forming the interfacial layer includes at least one of deposition, oxidation, nitridation, plasma immersion, and annealing. The interfacial layer includes at least one of a group II element, a group III element, a group IV element, a group V element, or a group VI element, such as at least one of oxygen, nitrogen, Si, and Ge. The dielectric layer and the interfacial layer are formed by the same method. The interfacial layer is formed above a channel region, and the channel region and the interfacial layer have at least one element in common. The interfacial layer is formed above a channel region, the interfacial layer includes a first semiconductor, the channel region includes a second semiconductor, and the first semiconductor and the second semiconductor are different. The semiconductor may include a group IV element, such as Si. At least a portion of the dielectric layer and at least a portion of the electrode layer are formed at different temperatures.

Like-referenced features represent common features in corresponding drawings.

DETAILED DESCRIPTION

Methods and materials are provided for forming a dielectric layer and an electrode layer in the same processing chamber, thereby simplifying process flow and enhancing yields. The resulting structures facilitate the fabrication of devices with small geometries and/or non-planar geometries.

Figure 1:
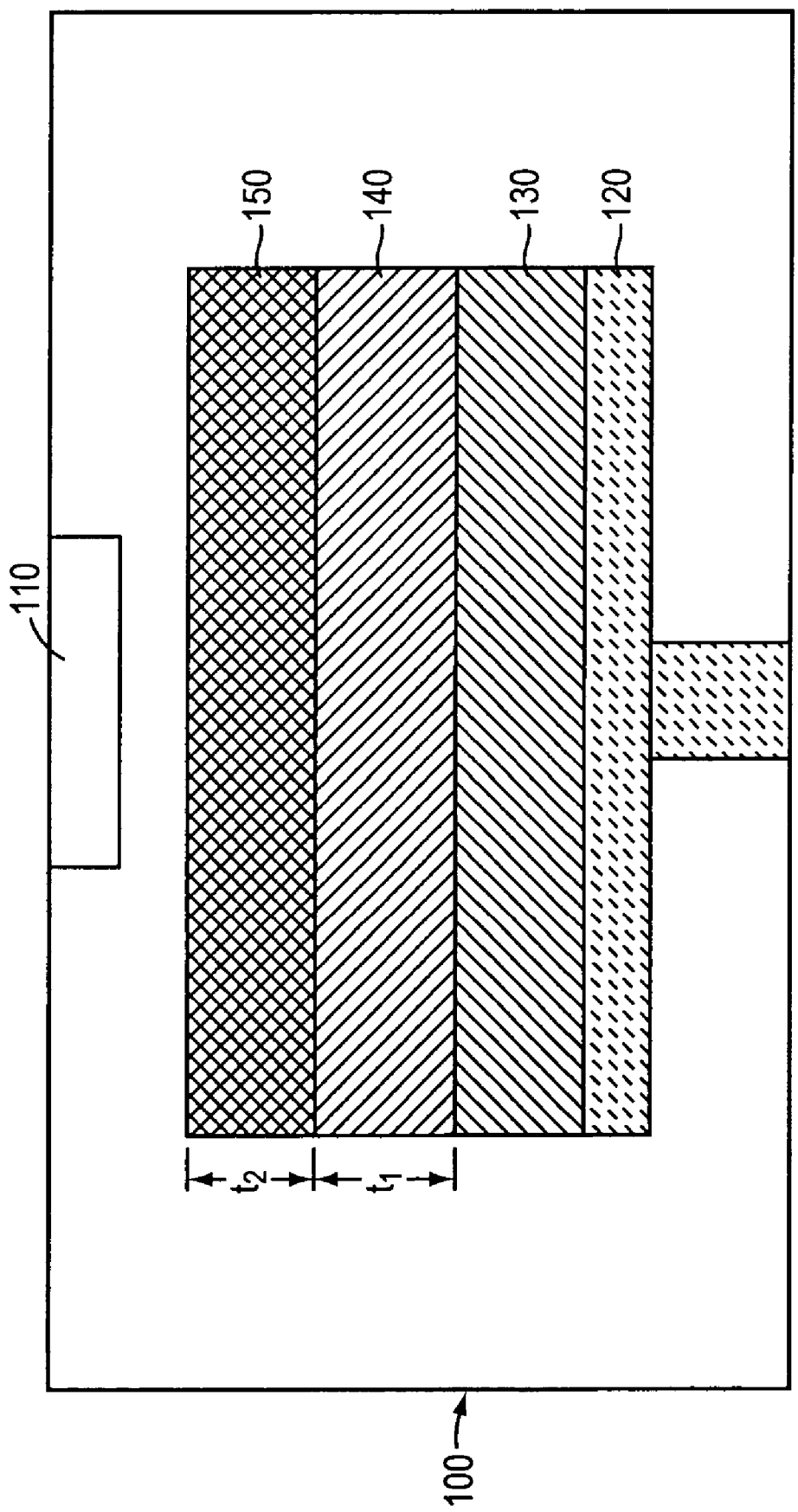
FIGS. 1-5, 6A-6B, and 7A-7B are schematic cross-sectional and top views illustrating the formation of alternative semiconductor structures.

Referring to FIG. 1, a thin-film deposition system amenable for use with the invention includes a processing chamber 100. In an embodiment, the processing chamber is a single-wafer chamber. Alternatively, the processing chamber may be adapted for batch processing. The thin-film deposition system may be an atomic layer deposition system, such as the IRIS system, available from VESTA Technology, Inc. of San Jose, Calif. Alternatively, the thin film deposition system may be a chemical vapor deposition system or plasma-enhanced chemical vapor deposition system, such as the CENTURA or PRODUCER system, available from Applied Materials, Inc. of Santa Clara, Calif.; a molecular beam epitaxy system, such as the GEN2000 system available from Veeco Instruments Inc. of Woodbury, N.Y.; or a sputtering system (i.e., a physical vapor deposition system), such as the ENDURA system available from Applied Materials. Other suitable deposition systems may also be used. The processing chamber 100 includes an inlet 110 that allows the introduction of one or more precursors into the chamber. The processing chamber 100 may also include a sputtering target (not shown). The processing chamber includes a substrate holder 120 for holding a substrate during processing.

In another embodiment, the thin-film deposition system may be a cluster tool in which two or more sub-chambers share a common load lock, control electronics, and robotic handling mechanism, such as the CENTURA GATE STACK cluster tool available from Applied Materials, Inc. In this case, processing chamber 100 may correspond to one or more of the sub-chambers, i.e., the substrate may be partially processed in one sub-chamber and then moved to another sub-chamber for a subsequent process. In such a cluster tool, the substrate will not be exposed to an uncontrolled ambient (e.g., outside air) between steps, rather it will move from one sub-chamber through the load lock to another sub-chamber in a closed, controlled, inert environment. Even if each sub-chamber of the cluster tool is configured for single-wafer processing, multiple wafers may be present in the tool simultaneously, up to one in each sub-chamber. Each sub-chamber may be configured for a different processing method, for example ALD, CVD, or PVD. Alternatively, multiple sub-chambers may be configured for the same processing method but for different materials. For example, two ALD sub-chambers may be configured for deposition of different materials. In an embodiment, the cluster tool may be configured to have one or more ALD sub-chambers. The cluster tool may have up to one sub-chamber per required process step, e.g., formation of a channel region, interfacial layer, dielectric layer, and electrode layer, as described below.

A layer structure including electrode and dielectric materials may be defined over a substrate in the processing chamber 100 as follows. A substrate 130 is introduced into the processing chamber 100 and placed upon the substrate holder 120. In an embodiment, the substrate 130 is a semiconductor substrate, such as a bulk Si wafer. Alternatively, the semiconductor substrate may be formed from another bulk group IV material, such as Ge, silicon carbide (SiC), diamond, or SiGe. In other embodiments, the semiconductor substrate may be a silicon-on-insulator (SOI) substrate, strained-semiconductor-on-insulator (SSOI) substrate, a III-V substrate, or a II-VI substrate. The semiconductor substrate may also include a surface epitaxial layer including or consisting essentially of approximately the same semiconductor material as the substrate (e.g., a Si epitaxial layer atop a Si substrate). The epitaxial layer may have a thickness suitable for device fabrication, e.g., approximately 0.5-2 micrometers (μm). The substrate may also be any form of rigid or semi-rigid support, and may therefore be formed of materials other than semiconductors, such as metal, polymers, plastic, or glass.

A dielectric layer 140 is formed over the substrate 130 in the processing chamber 100. The dielectric layer 140 may be formed by any suitable processing method, such as atomic layer deposition, chemical vapor deposition (plasma-enhanced or otherwise), molecular beam epitaxy, or sputtering (i.e., physical vapor deposition). In an embodiment, the deposition of the dielectric layer 140 includes the use of a first precursor. The first precursor may be, for example, a metal halide such as hafnium chloride ($HfCl_4$) or zirconium chloride ($ZrCl_4$); an organometallic compound such as tetrakis-diethylamido hafnium (TDEAHf, i.e., $Hf[N(C_2H_5)_2]_4$); a metal such as hafnium, aluminum, or zirconium; or a metal nitride such as hafnium nitride (HfN). Suitable organometallic compounds may include a metallic component and an organic component. The metallic component may comprise or consist of one or more group IIIA metals, such as aluminum; transition metals, such as scandium, yttrium, lanthanum, titanium, zirconium, hafnium, tantalum, ruthenium, niobium, platinum, palladium, rhodium, molybdenum, tungsten, chromium, and iridium; rare earth metals, such as cerium, praseodymium, neodymium, gadolinium, samarium, europium, terbium, dysprosium, holmium, erbium, thulium, ytterbium, and lutetium; alkali metals, such as lithium; or alkaline earth metals such as beryllium, magnesium, calcium, strontium, and barium. The organic component includes elements such as carbon, oxygen, nitrogen, and hydrogen combined into functional groups such as isopropyl or tert-butyl groups. Specific examples of suitable organometallic compounds include metal acetamidinates such as triisopropylacetamidinato lanthanum; metal alkyl compounds such as $Al(CH_3)_3$ or $Al(C_2H_5)_3$; metal alkoxide compounds such as $Al(OC_2H_5)_3$, $Zr(OC(CH_3)_3)_4$, or $Ti(OC_2H_5)_4$; β-diketonato metal complexes such as $La(thd)_3$ (thd represents tetramethyl heptanedione) or $Ga(acac)_2$ (acac represents acetyl acetonate); cyclopentadienyl metal compounds such as $Zr(C_5H_5)_2Cl_2$ or $Mg(C_5H_5)_2$; metal carboxylates such as $Zn(CH_3COO)_2$; or metal alkylamides or silylamides such as $Ti(N(CH_3)_2)_4$ or $Ti(N(C_2H_5)(CH_3))_4$.

The dielectric layer 140 includes a dielectric material that may include a first metal nitride and/or a metal oxide. The metal may comprise or consist of one or more group IIIA metals, such as aluminum; transition metals, such as scandium, yttrium, lanthanum, titanium, zirconium, hafnium, tantalum, ruthenium, niobium, platinum, palladium, rhodium, molybdenum, tungsten, chromium, and iridium; rare earth metals, such as cerium, praseodymium, neodymium, gadolinium, samarium, europium, terbium, dysprosium, holmium, erbium, thulium, ytterbium, and lutetium; alkali metals, such as lithium; or alkaline earth metals such as beryllium, magnesium, calcium, strontium, and barium. The first metal nitride and/or the metal oxide may be amorphous. Dielectric layer 140 may also include a metal oxynitride, for example zirconium oxynitride or hafnium oxynitride. In another embodiment, dielectric layer 140 may be a stacked structure including different layers that may include combinations of metal nitrides, metal oxides, and metal oxynitrides.

Dielectric layer 140 may be formed by a deposition method that enables a high degree of uniformity in thickness and composition, e.g., atomic layer deposition. Dielectric layer 140 may have a thickness uniformity of better than ±10%, or alternatively, better than ±0.5 nm. In an embodiment, the thickness uniformity may be better than ±0.2 nm or better than ±5%.

After the formation of the dielectric layer 140, an electrode layer 150 is subsequently formed in the same processing chamber 100 and without removing the substrate 130 therefrom, directly over and in contact with the dielectric layer 140. In a cluster tool, formation of electrode layer 150 may be performed in the same sub-chamber as formation of dielectric layer 140. Alternatively, substrate 130 may be moved to a dedicated sub-chamber for formation of electrode layer 150 without leaving the cluster tool or being exposed to an outside ambient. The electrode layer may be formed by any suitable processing method, such as atomic layer deposition, chemical vapor deposition, molecular beam epitaxy, or sputtering. The dielectric layer and the electrode layer formation methods may be substantially the same, e.g., both layers may be formed by atomic layer deposition.

In an embodiment, the deposition of the electrode layer 150 includes the utilization of a second precursor. The second precursor may be, for example, a metal halide such as $HfCl_4$ or $ZrCl_4$; an organometallic compound such as TDEAHf, i.e., $Hf[N(C_2H_5)_2]_4$; a metal such as hafnium, aluminum, or zirconium; or a metal nitride such as HfN. In an embodiment, both of the dielectric and electrode layers are formed from substantially the same precursor. For example, the dielectric layer may include zirconium oxide ($ZrO_2$) formed by the use of zirconium chloride and the electrode layer may include zirconium nitride (ZrN), also formed by the use of zirconium chloride.

In an alternative embodiment, the dielectric layer is formed from one or more precursor(s) different from the precursor(s) from which the electrode layer is formed. For example, the composition of the precursor used to form the dielectric layer may be different from a composition of the precursor used to form the electrode layer. The dielectric layer may include hafnium dioxide ($HfO_2$) formed by use of, e.g., $Hf[NC_2H_6]_4$ or $Hf[OC(CH_3)_3]_4$, and the electrode layer may include hafnium formed by the use of, e.g., a bulk metallic hafnium sputtering target. In another instance, the same precursor may be used to form the two layers, but in a different ambient or in combination with a different second precursor. Here, the dielectric layer may contain $HfO_2$ that is formed by atomic layer deposition or chemical vapor deposition with the use of the precursor TDEAHf in combination with an oxidizing agent such as oxygen gas, atomic oxygen, or water vapor. The electrode layer, containing HfN, may subsequently be formed by atomic layer deposition or chemical vapor deposition, also with the use of the precursor TDEAHf but in combination with a nitriding agent such as ammonia gas, nitrogen gas, or atomic nitrogen.

In yet another instance, the same precursor may be used to form the two layers, but in combination with other additional precursors. In one example, a dielectric layer including nitrogen-rich hafnium nitride ($Hf_3N_4$) is formed with a Hf-based halide, such as $HfCl_4$, in combination with nitrogen gas by chemical vapor deposition or atomic layer deposition. Then, an electrode layer is formed with the same Hf-based halide, but in combination with ammonia gas, resulting in the formation of HfN electrode material. In another example, the dielectric layer is formed by sputtering Hf metal in an $Ar/N_2$ gas mixture ambient having a first ratio, resulting in the formation of HfN. Subsequently, the electrode layer is formed by sputtering Hf metal in an $Ar/N_2$ gas mixture ambient having a second ratio different from the first ratio, resulting in the formation of $Hf_3N_4$. The first ratio of $Ar/N_2$ may be at least 5:1, and the second ratio of $Ar/N_2$ may be less than 5:1, e.g., 2:1.

The electrode layer 150 may include at least one of a metal or a second metal nitride. The first metal nitride of the dielectric layer 140 and the second metal nitride of the electrode layer 150 may have at least one metal in common. The metal may comprise or consist of one or more group IIIA metals, such as aluminum; transition metals, such as scandium, yttrium, lanthanum, titanium, zirconium, hafnium, tantalum, ruthenium, niobium, platinum, palladium, rhodium, molybdenum, tungsten, chromium, and iridium; rare earth metals, such as cerium, praseodymium, neodymium, gadolinium, samarium, europium, terbium, dysprosium, holmium, erbium, thulium, ytterbium, and lutetium; alkali metals, such as lithium; or alkaline earth metals such as beryllium, magnesium, calcium, strontium, and barium. For example, the dielectric layer 140 may include or consist of $Hf_3N_4$ and the electrode layer may include or consist of HfN.

The first metal nitride of the dielectric layer 140 and the second metal nitride of the electrode layer 150 may have different crystallographic structures. For example, the first metal nitride may be $Hf_3N_4$ or $Zr_3N_4$ with an orthorhombic crystallographic structure, and the second metal nitride may be HfN or ZrN with a cubic rock-salt crystallographic structure. In an embodiment, the first metal nitride is amorphous and the second metal nitride has a crystalline structure, e.g., the first metal nitride includes amorphous $Hf_3N_4$ and the second metal nitride includes crystalline HfN.

The composition of the first metal nitride may include $(metal)N_x$, e.g., ZrN or HfN, and the second metal nitride may include $(metal)N_y$, e.g., ZrN or HfN. In an embodiment, the nitrogen content of the first metal nitride x is greater than the nitrogen content of the second metal nitride. For example, x may be approximately equal to 1.33 and y may be approximately equal to 1, e.g., the first metal nitride may be $HfN_{1.33}$ (i.e., $Hf_3N_4$) and the second metal nitride may be HfN.

In an embodiment, the dielectric layer 140 includes a dielectric material having a dielectric constant greater than about 9, such as $Al_2O_3$ (dielectric constant of approximately 9.5); greater than about 20, such as $HfO_2$, $ZrO_2$ (dielectric constant of approximately 22), or tantalum pentoxide ($Ta_2O_5$ - dielectric constant of approximately 25); or greater than 50, such as $TiO_2$ (dielectric constant of approximately 80). Alternatively, dielectric layer 140 may include multiple layers of dielectric material, the weighted average of which provides an effective dielectric constant that falls within one of the above preferred ranges.

In an embodiment, the dielectric layer 140 includes a dielectric material comprising a metal oxide, and the electrode layer 150 includes a metal nitride. Each of the metal oxide and metal nitride include the same metal. The metal may comprise or consist of one or more group IIIA metals, such as aluminum; transition metals, such as scandium, yttrium, lanthanum, titanium, zirconium, hafnium, tantalum, ruthenium, niobium, platinum, palladium, rhodium, molybdenum, tungsten, chromium, and iridium; rare earth metals, such as cerium, praseodymium, neodymium, gadolinium, samarium, europium, terbium, dysprosium, holmium, erbium, thulium, ytterbium, and lutetium; alkali metals, such as lithium; or alkaline earth metals such as beryllium, magnesium, calcium, strontium, and barium. For example, dielectric layer 140 may include $ZrO_2$ and the electrode layer 150 may include ZrN. The dielectric material may include a high-k dielectric having a dielectric constant greater than approximately 20, e.g., $HfO_2$.

In an alternative embodiment, the dielectric layer 140 includes a dielectric material comprising a metal oxide and the electrode layer 150 includes a metal. The metal oxide and the metal each include the same metal. The metal may comprise or consist of one or more group IIIA metals, such as aluminum; transition metals, such as scandium, yttrium, lanthanum, titanium, zirconium, hafnium, tantalum, ruthenium, niobium, platinum, palladium, rhodium, molybdenum, tungsten, chromium, and iridium; rare earth metals, such as cerium, praseodymium, neodymium, gadolinium, samarium, europium, terbium, dysprosium, holmium, erbium, thulium, ytterbium, and lutetium; alkali metals, such as lithium; or alkaline earth metals such as beryllium, magnesium, calcium, strontium, and barium. For example, the gate dielectric layer 140 may include $HfO_2$ and the electrode layer 150 may include hafnium.

Electrode layer 150 may be formed by a deposition method that enables a high degree of uniformity in thickness and composition, e.g., atomic layer deposition. Electrode layer 150 may have a thickness uniformity of better than ±10%, or alternatively, better than ±5 nm. In an embodiment, the thickness uniformity may be better than ±2 nm or better than ±5%.

In an embodiment, the dielectric layer 140 is suitable for use as a gate dielectric layer of a device such as a transistor and the electrode layer 150 is suitable for use as a gate electrode layer of a device such as a transistor. See, for example, the discussion below with reference to FIG. 5. The dielectric layer 140 has a thickness $t_1$ selected in combination with the dielectric material of the dielectric layer to provide a suitable capacitance for a device into which the dielectric layer 140 will be incorporated. The thickness $t_1$ may be selected from a range of 0.8 to 10 nm, and more preferably from a range of 1 to 6 nm. The dielectric layer may include a dielectric material having a high-k dielectric with a dielectric constant greater than that of $SiO_2$, i.e., a dielectric constant greater than 3.9. For example, the high-k dielectric may be $ZrO_2$, which has a dielectric constant of 22.

The gate electrode layer 150 has a thickness $t_2$ selected in combination with the material of the gate electrode layer to provide a suitable work function for a device into which the gate electrode layer 150 will be incorporated. The thickness $t_2$ may be selected from a range of 20 to 200 nm, and more preferably from a range of 50 to 100 nm.

Figure 2:
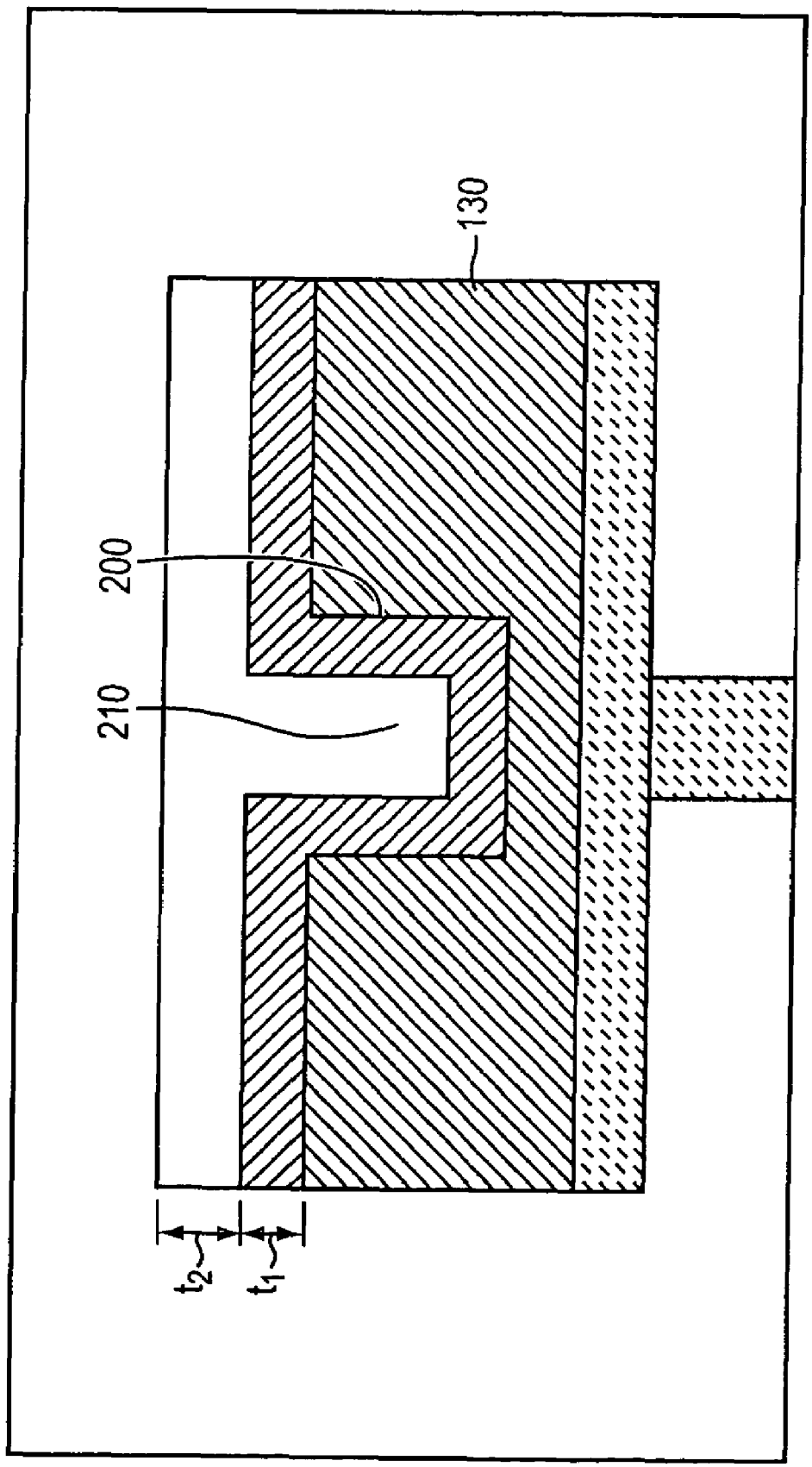

Referring to FIG. 2, in an embodiment, the dielectric layer 140 is a dielectric layer of a trench capacitor, and the electrode layer 150 is the inner electrode of a trench capacitor. The trench capacitor is formed as follows. A trench 200 is defined in substrate 130. The trench 200 may have a depth of about 5000 nm and a width of about 100 nm, equivalent to an aspect ratio of 50:1. In another embodiment, the aspect ratio may be greater than 50:1, or even greater than 100:1. The dielectric layer 140 is formed over the substrate and along the sidewalls of the trench 200. Subsequently, the electrode layer 150 is deposited over the dielectric layer 140 to form the inner electrode 210.

The dielectric layer 140 has a thickness $t_1$ selected in combination with the dielectric material of the dielectric layer to provide a suitable capacitance for the trench capacitor into which the dielectric layer 140 will be incorporated. The thickness $t_1$ may be selected from a range of 1 to 100 nm, and more preferably from a range of 10 to 50 nm. The dielectric layer may include a dielectric material having a high-k dielectric with a dielectric constant greater than that of $SiO_2$, i.e., a dielectric constant greater than 3.9. For example, the high-k dielectric may be $TiO_2$, which has a dielectric constant of 80.

The electrode layer 150 has a thickness $t_2$ selected in combination with the material of the electrode layer to provide a suitable conductivity for the trench capacitor into which the electrode layer 150 will be incorporated. The thickness $t_2$ may be selected from a range of 10 to 100 nm, and more preferably from a range of 25 to 50 nm. Thickness $t_2$ may be selected such that electrode layer 150 substantially fills the remaining volume of the trench and can thus be contacted at the top surface near the top of the trench. Dielectric layer 140 and electrode layer 150 may subsequently be removed from certain areas of substrate 130, e.g., on surfaces not within trench 200.

Depending on the choice of substrate 130, it may also be necessary to deposit an outer electrode on the sidewalls and bottom of trench 200 prior to formation of dielectric layer 140. For example, since the outer electrode should be a conductor or semiconductor, use of an insulating substrate may necessitate formation of the outer electrode via the same methods and from the same materials described above with reference to electrode layer 150. Even in an embodiment in which substrate 130 includes a semiconductor, a metal outer electrode may be preferred to reduce resistance. The formation of the outer electrode, dielectric layer 140, and electrode layer 150 may take place in the same processing tool, and may include the sharing of common precursors. If a cluster tool is used, a sub-chamber of the tool may be dedicated to the etching of the trench, and substrate 130 may proceed directly from the etch step to the formation of dielectric layer 140 and electrode layer 150 without exposure to an outside ambient.

Dielectric layer 140 may be formed by a deposition method that enables a high degree of uniformity in thickness and composition, e.g., atomic layer deposition. Such a technique may be required for structures including trenches with aspect ratios greater than 100:1. Dielectric layer 140 may have a thickness uniformity of better than ±10%, or alternatively, better than ±0.5 nm, even on non-coplanar surfaces such as the sidewalls and bottom of trench 200. In an embodiment, the thickness uniformity may be better than ±0.2 nm or better than ±5%.

The outer electrode and electrode layer 150 may be formed by a deposition method that enables a high degree of uniformity in thickness and composition, e.g., atomic layer deposition. The outer electrode and electrode layer 150 may have a thickness uniformity of better than ±10%, or alternatively, better than ±5 nm. In an embodiment, the thickness uniformity may be better than ±2 nm or better than ±5%.

Figure 3:
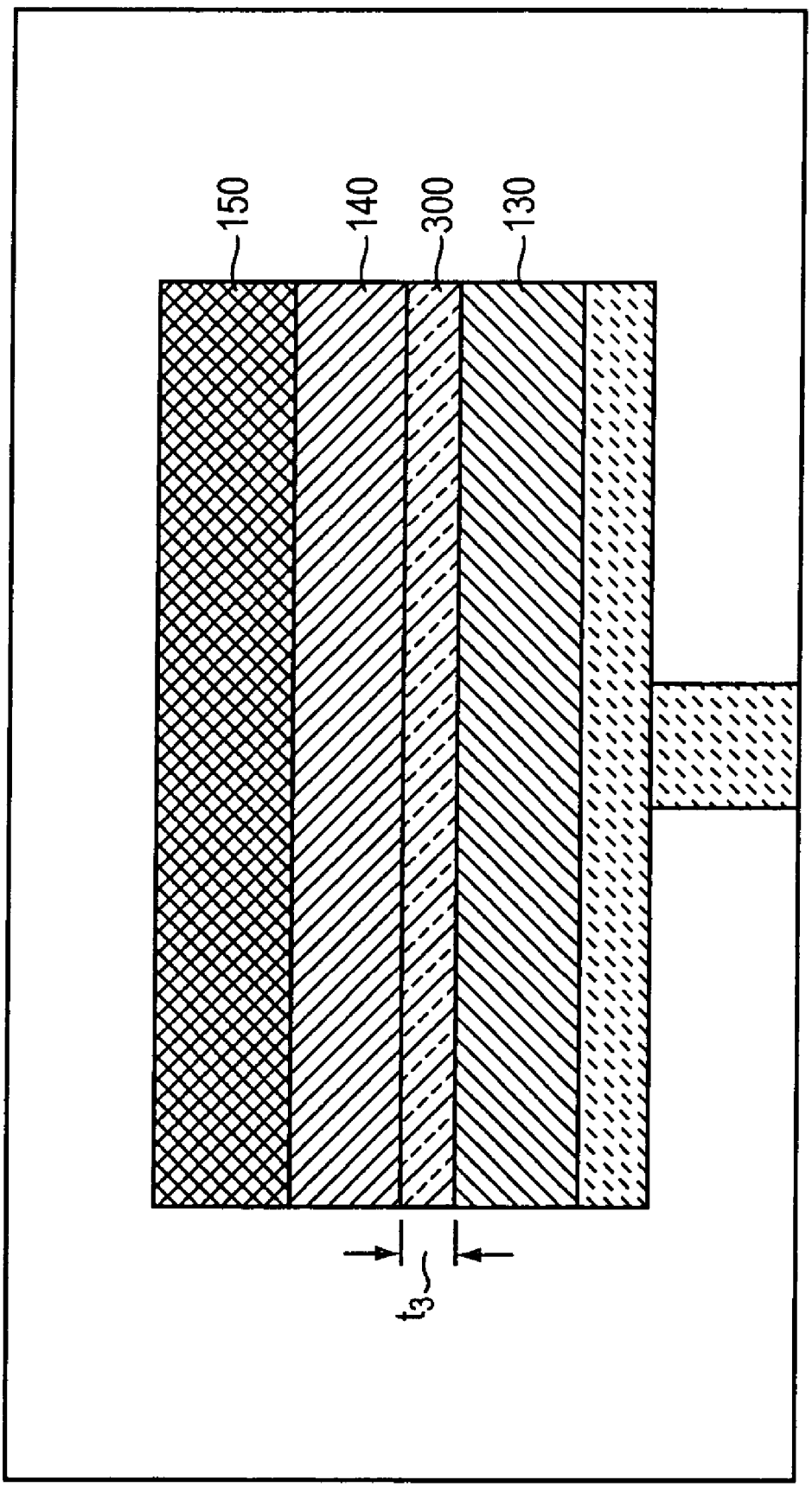

Referring to FIG. 3, an interfacial layer 300 may be formed in the layer structure at an interface between the dielectric layer 140 and the substrate 130. The interfacial layer 300 may be desirable to help prevent gate leakage or improve carrier mobility in a device that utilizes dielectric layer 140 as a gate dielectric and electrode layer 150 as a gate electrode. In some embodiments, the substrate includes Si, the gate dielectric layer includes nitrogen and the interfacial layer 300 includes oxygen, thereby mitigating the carrier mobility loss in an underlying Si channel that may be caused by a nitrogen-containing gate dielectric layer. A direct interface between the nitrogen-containing material and the Si substrate may be of poor quality having a high proportion of surface states, whereas the interface between the oxygen-containing material and the Si substrate is of high quality. In other embodiments, the substrate includes Ge and the interfacial layer includes nitrogen. Here, the nitrogen-containing material forms a better interface with the Ge substrate than would an overlying oxygen-containing gate dielectric layer.

The interfacial layer 300 may include any suitable material, such as at least one of a group II element, a group III element, a group IV element, a group V element, or a group VI element. It may include or consist of, for example, at least one of the following elements: oxygen, nitrogen, Si, and Ge. As noted above, an oxygen-containing interfacial layer 300 may be preferred for a Si substrate and a nitrogen-containing interfacial layer 300 may be preferred for a Ge or III-V substrate.

The interfacial layer 300 has a thickness $t_3$ selected from the range of about 0.1 to about 1 nm. The thickness $t_3$ is selected in combination with the material forming the interfacial layer, such that the interfacial layer 300 provides the functionality desired, e.g., a good quality interface with the substrate that enhances carrier mobility in an underlying channel. The thickness $t_3$ may also be selected to be thinner than the thickness $t$, of dielectric layer 140. The interfacial layer 300 may comprise or consist essentially of a semiconductor, such as Si, selected to provide a superior interface with dielectric layer 140 and underlying layers or the underlying substrate, particularly if underlying layers or the underlying substrate do not include or consist essentially of Si. Alternatively, interfacial layer 300 may comprise or consist of a dielectric material. Since the effective dielectric constant of the interfacial layer and the dielectric layer stack is the weighted average of the two layers, and since the dielectric constant of the interfacial layer may be lower than that of the dielectric layer (e.g., less than 20, or even less than 10), the thickness $t_3$ of the interfacial layer 300 is preferably thinner than the thickness $t_1$ of the dielectric layer 140, to thereby ensure a relatively high effective dielectric constant.

The interfacial layer 300 may be formed by various methods, such as deposition, oxidation (e.g., rapid thermal oxidation), nitridation, plasma immersion, or annealing. Interfacial layer 300 may be formed by a method that enables a high degree of uniformity in thickness and composition, e.g., atomic layer deposition, oxidation, or nitridation. Interfacial layer 300 may have a thickness uniformity of better than ±10%, or alternatively, better than ±0.1 nm. In an embodiment, the thickness uniformity may be better than ±0.05 nm or better than ±5%.

In an embodiment, interfacial layer 300 and dielectric layer 140 are formed in the same processing chamber 100 and without removing the substrate 130 therefrom. In a cluster tool, interfacial layer 300 and the dielectric layer 140 may be formed in the same sub-chamber. Alternatively, substrate 130 may be moved to a dedicated sub-chamber for formation of interfacial layer 300 without leaving the cluster tool or being exposed to an outside ambient.

In an embodiment, the dielectric layer 140 and the interfacial layer 300 are formed by the same method. For example, the interfacial layer 300 may include or consist of Si, Ge, $SiO_2$, silicon nitride ($Si_3N_4$), germanium oxide ($GeO_2$), germanium nitride ($Ge_3N_4$), germanium oxynitride (GeON), or SiON, formed by atomic layer deposition, and subsequently, the dielectric layer 140 may be formed by atomic layer deposition and may include or consist of a metal oxide or metal nitride such as $HfO_2$, HfN, $ZrO_2$, aluminum oxide ($Al_2O_3$), or ZrN. Furthermore, both the interfacial layer and the dielectric layer may each be formed by any of the deposition methods describe above with respect to the formation of the dielectric layer 140.

In an embodiment, the interfacial layer 300 is formed by oxidation of a surface of the substrate 130 prior to the formation of the dielectric layer 140. For example, a Si substrate may be oxidized in an oxygen ambient for, e.g., 10 seconds at 1000° C. to form a $SiO_2$ interfacial layer 300. Alternatively, oxidation may take place after formation of dielectric layer 140. Oxygen may diffuse through dielectric layer 140 and react with substrate 130 at the interface between substrate 130 and dielectric layer 140 to form interfacial layer 300.

In another embodiment, the interfacial layer 300 is formed by nitridation of a surface of the substrate 120 prior to the formation of the dielectric layer 130. For example, a Si substrate may be exposed to an ammonia ambient for, e.g., 30 seconds at 1100° C. to form a $Si_3N_4$ interfacial layer 300. Alternatively, nitridation may take place after formation of dielectric layer 140. Nitrogen may diffuse through dielectric layer 140 and react with substrate 130 at the interface between substrate 130 and dielectric layer 140 to form interfacial layer 300.

In another embodiment, the interfacial layer 300 is formed by plasma immersion. Prior to the formation of the dielectric layer 140 and electrode layer 150, the substrate 130 is exposed to a plasma. The plasma species are selected to react with the material of the substrate 130 to form the interfacial region. For example, a clean Si substrate may be exposed to an oxygen-containing plasma to form an oxygen-containing interfacial layer 300 or to a nitrogen-containing plasma to form a nitride-containing interfacial layer 300.

In still another embodiment, the interfacial layer 300 is formed by annealing. For example, dielectric layer 140 containing oxygen, e.g., $HfO_2$ or $ZrO_2$, is formed over a Si-containing substrate. The substrate and dielectric layer 140 are annealed at 1000° C. for 1 minute, resulting in the formation of interfacial layer 300 containing $SiO_2$. The annealing step may take place in the same processing chamber 100 in which the dielectric layer 140 and the electrode layer 150 are formed, before the formation of the electrode layer. Alternatively, the electrode layer may be formed in processing chamber 100 and the anneal may be subsequently carried out in a separate piece of equipment.

Figure 4:
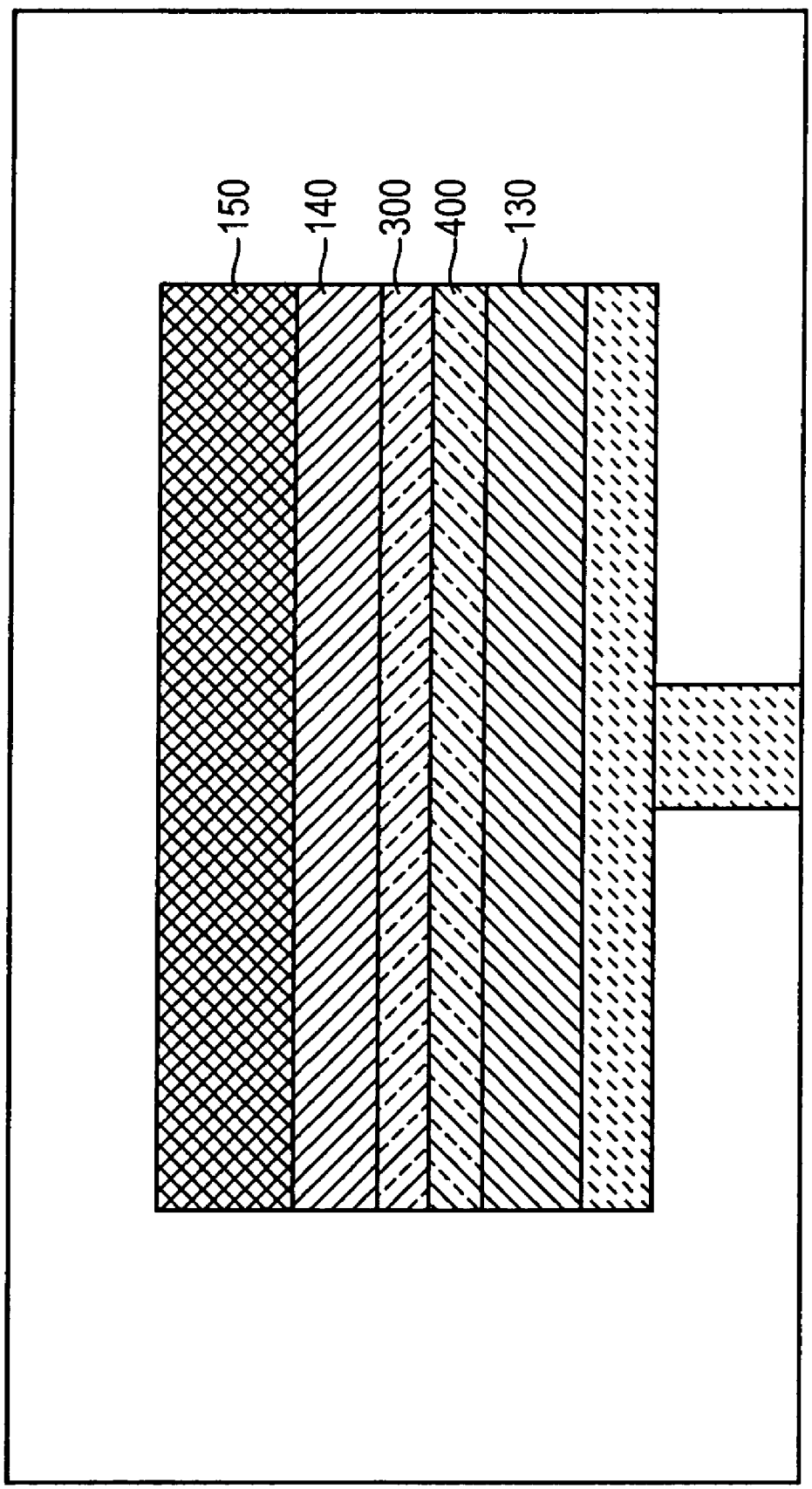

Referring also to FIG. 4, in an embodiment, the substrate 130 has a channel region 400. The interfacial layer 300 is formed above the channel region 400, and the channel region 400 and the interfacial layer 300 have at least one element in common if interfacial layer 300 consists of a dielectric material. For example, the channel region 400 may include strained Si, and the interfacial layer 300 may include $SiO_2$ or SiON. In the absence of interfacial layer 300, the channel region 400 may share at least one element in common with the dielectric layer 140. For example, the channel region 400 may include InGaAs, and the dielectric layer 140 may include gallium gadolinium oxide ($[Ga_xGd_{1-x}]_2O_3$).

In another embodiment, interfacial layer 300 may include or consist essentially of a semiconductor material different from a semiconductor material found in channel region 400, thus providing a superior interface between channel region 400 and dielectric layer 140. For example, channel region 400 could include Ge or a III-V semiconductor such as indium gallium arsenide and interfacial layer 300 may include Si.

More generally, the channel region 400 may include a semiconductor including at least one of a group II, group III, a group IV, a group V, or a group VI element. It may include, for example, Si, Ge, SiGe, GaAs, GaN, ZnO, InGaAs, InSb, indium phosphide (InP) and/or ZnSe. The channel region 400 may have a starting thickness of, for example, 50-1000 Å.

In another embodiment, channel region 400 may include at least one carbon nanotube, or a semiconductor or metallic nanowire. The channel region may be under strain, e.g., tensile or compressive strain. The strain may be primarily uniaxial, primarily biaxial, or hydrostatic in nature. Strain in channel region 400 may arise from the formation of a strain-inducing material in the vicinity of channel region 400, and may result from lattice mismatch or thermal mismatch between channel region 400 and such material. The strain-inducing material may be a semiconductor material lattice-mismatched to channel region 400, e.g., SiGe or SiC, or may be a strain-inducing insulating overlayer such as $Si_3N_4$ or SiON. In an embodiment, the strain-inducing material is a void of gaseous material formed within substrate 130 by implantation of oxygen, hydrogen, helium, or another inert gas.

The channel region 400 may be defined in the processing chamber 100 prior to the formation of dielectric layer 140 in the same processing chamber 100; the substrate need not be removed from the processing chamber between these steps. For example, a relaxed SiGe layer may be formed over the substrate 120. Then, a strained Si layer may be formed over the SiGe layer to define the channel region 400. In this embodiment, the relaxed SiGe layer induces strain in the strained Si layer. Channel region 400 may be formed across the entire surface of substrate 120 or may only be formed in selected regions defined on substrate 120 by, e.g., a masking material such as $SiO_2$ or $Si_3N_4$. In such an embodiment, channel region 400 may be formed selectively on regions not masked by the masking material. Selectivity may be enabled by the use of halogenated precursors, such as chlorinated precursors like dichlorosilane ($SiH_2Cl_2$), silicon tetrachloride ($SiCl_4$), or germanium tetrachloride ($GeCl_4$), or by the use of a precursor in tandem with hydrogen chloride (HCl), chlorine ($Cl_2$), or other halogen gas during growth to remove spurious nuclei of channel material from the masking material during growth.

As discussed above, channel region 400 and dielectric layer 140 (and/or interfacial layer 300) may be formed in the same processing chamber 100 and without removing the substrate 130 therefrom. In a cluster tool, channel region 400, dielectric layer 140 and/or interfacial layer 300, may be formed in the same sub-chamber. Alternatively, substrate 130 may be moved to a dedicated sub-chamber for formation of channel region 400 without leaving the cluster tool or being exposed to an outside ambient.

Channel region 400 may be formed by a deposition method that enables a high degree of uniformity in thickness and composition, e.g., atomic layer deposition. Channel region 400 containing Si may be formed by CVD or ALD with precursors such as dichlorosilane, silane, disilane, or trisilane. Channel region 400 containing Ge may be formed by chemical vapor deposition with precursors such as germane or digermane. Channel region 400 containing a III-V or II-VI material may be formed by CVD or ALD with organometallic precursors such as trimethyl indium and trimethyl aluminum in combination with hydrides (e.g., arsine, stibine) or other gases (e.g., hydrogen, oxygen, or water vapor). Channel region 400 may be formed from an isotopically pure precursor(s). Isotopically pure materials (e.g., Si or Ge) have better thermal conductivity than materials present as mixtures of atomic isotopes. Higher thermal conductivity may help dissipate heat from devices subsequently formed on the channel region 400, thereby maintaining the enhanced carrier mobilities provided by the channel region 400. Channel region 400 may have a thickness uniformity of better than ±10%, or alternatively, better than ±2 nm. In an embodiment, the thickness uniformity may be better than ±0.5 nm or better than ±5%.

After formation, channel region 400 has an initial misfit dislocation density of, for example, $0\text{-}10^5$ cm/cm$^2$. In an embodiment, channel region 400 has an initial misfit dislocation density of approximately 0 cm/cm$^2$. Because misfit dislocations are linear defects generally lying within a plane between two crystals within an area, they may be measured in terms of total line length per unit area. Misfit dislocation density, therefore, may be expressed in units of dislocations/cm or cm/cm$^2$. In one embodiment, channel region 400 may be tensilely strained, e.g., Si formed over SiGe. In another embodiment, channel region 400 may be compressively strained, e.g., Ge formed over SiGe.

Channel region 400 may have a surface particle density of, e.g., less than about 0.3 particles/cm$^2$. As used herein, "surface particle density" includes not only surface particles but also light-scattering defects, and crystal-originated pits (COPs), and other defects incorporated into channel region 400. Process optimization may enable reduction of the localized light-scattering defect levels to about 0.09 defects/cm$^2$ for particle defects having a size greater than 0.09 μm and to 0.05 defects/cm$^2$ for particle defects having a size greater than 0.12 μm. These surface particles may be incorporated in the channel region 400 during the formation thereof, or they may result from the propagation of surface defects from an underlying layer.

Figure 5:
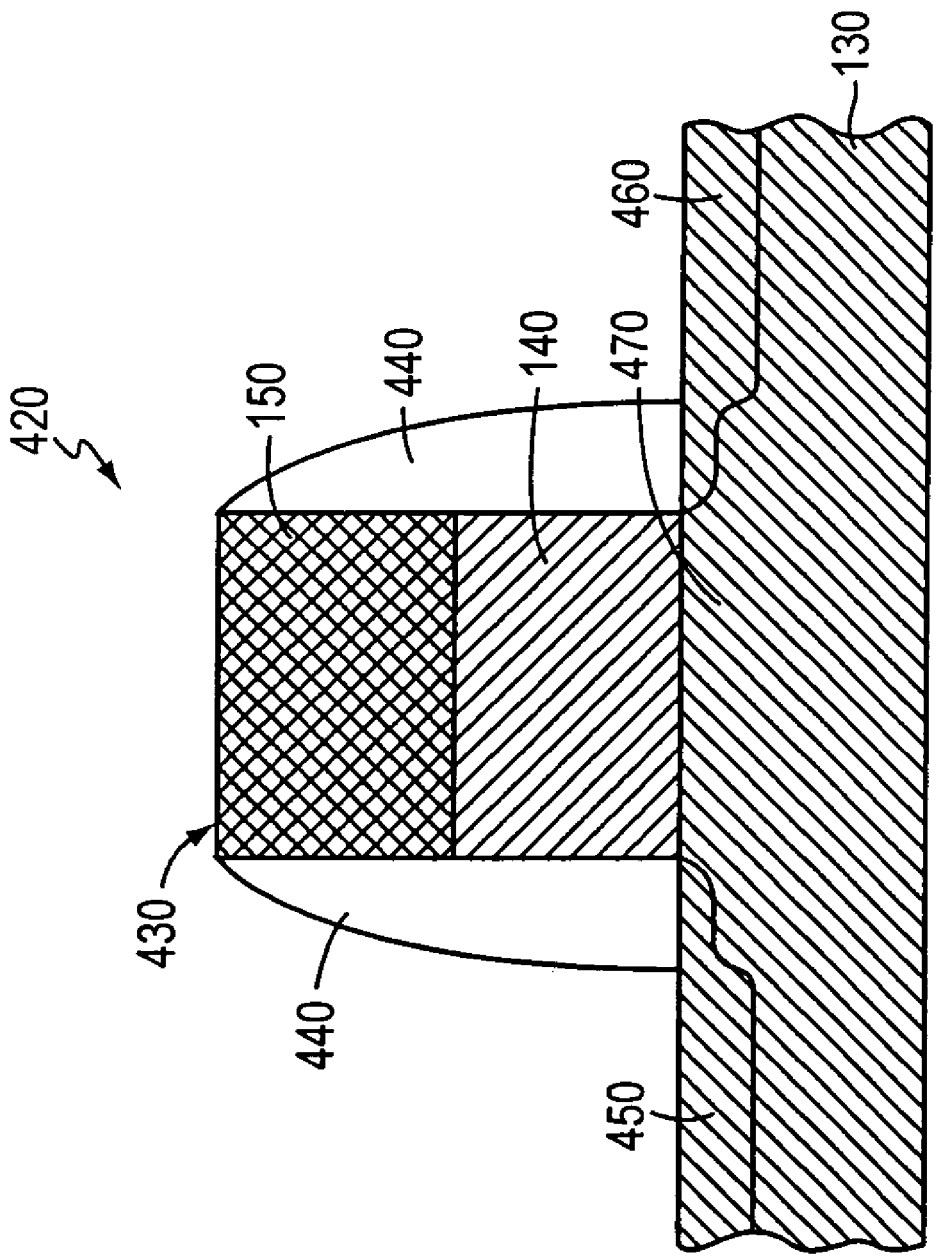

Referring to FIG. 5, any of the structures illustrated in FIGS. 1-4 may be further processed to define devices by methods known in the art. For example, transistor 420 may be formed by patterning dielectric layer 140 and electrode layer 150, i.e., gate dielectric and gate electrode layers, to define a gate 430. Subsequent processing may include the formation of a pair of sidewall spacers 440, and source and drain regions 450, 460 proximate the gate 430. A channel region 470 (which may include a portion of the aforementioned channel region 400) is disposed below the gate 430. The channel region and the gate dielectric layer and/or the interfacial layer may have at least one element in common, e.g., the gate dielectric layer may include GeON and the channel region may include Ge. In an embodiment, the channel region (and perhaps the interfacial layer) is formed over the semiconductor substrate 130 in the processing chamber 100, and the semiconductor substrate 130 remains in the same processing chamber, and without removing the substrate 130 therefrom, during the formation of the gate dielectric layer.

Figure 6A:
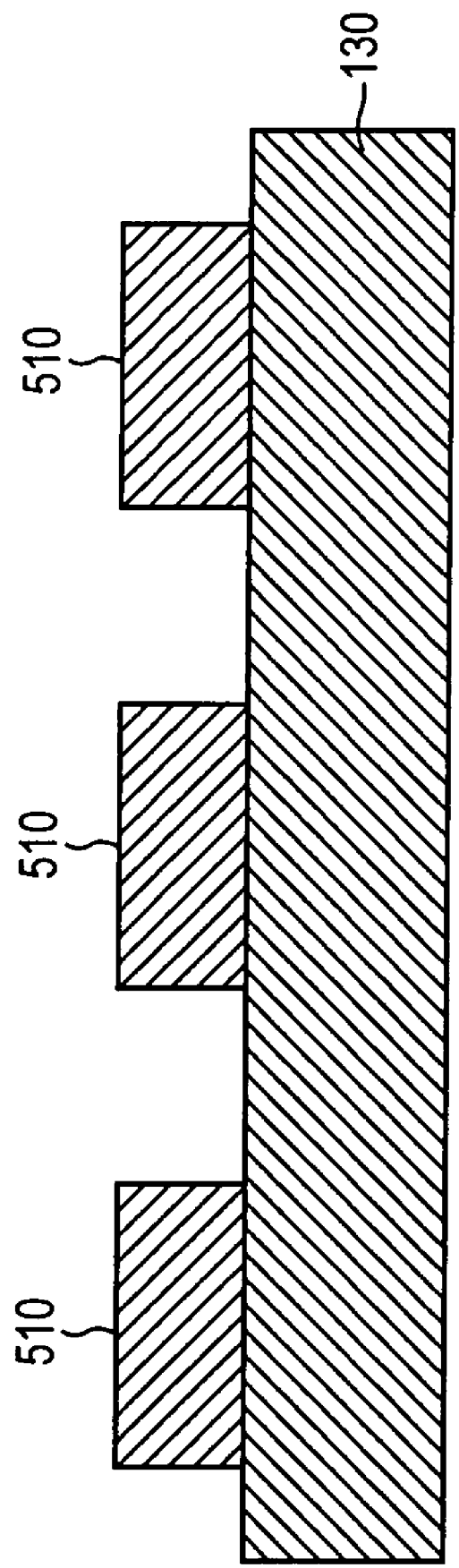
Figure 6B:
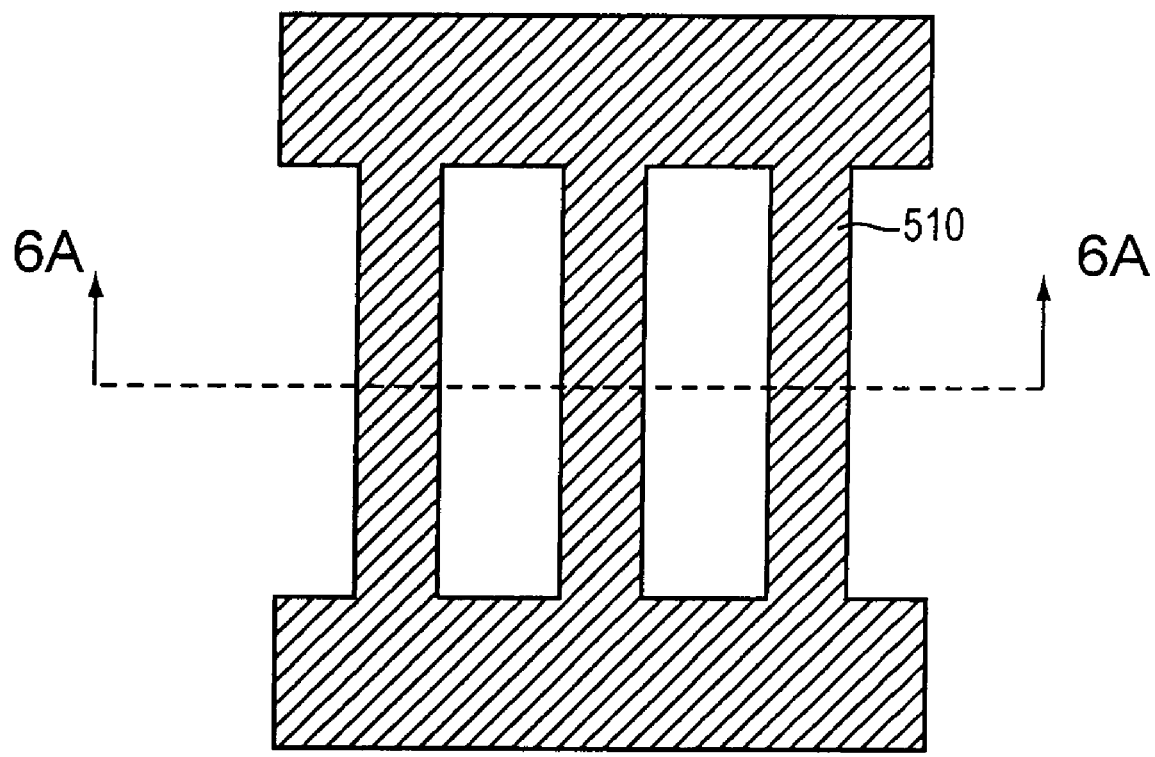

Referring to FIGS. 6A and 6B, in an embodiment, substrate 130 is patterned such that a fin field-effect-transistor (finFET) is formed on substrate 130. FinFETs, like double-gate MOSFETs, typically have two gates (one on either side of the channel, where the channel is here oriented vertically) allowing much greater control of channel charge than in a single gate device. This configuration also has the potential to translate to higher drive current and lower stand-by leakage current. Devices related to the finFET, such as the wrap-around gate FET (gate on both sides of as well as above the channel), omega FET, tri-gate FET, or multiple-gate FET (MUGFET) allow even more channel charge control and hence even more potential for improved drive current and leakage current performance. Unlike in a traditional planar FET, this channel region is raised above the wafer surface: the channel (or portions of the channel) falls in a plane perpendicular (or at least non-parallel) to the wafer surface. There may in addition be gates below the channel region, such as in the wrap-around gate FET. The substrate 130 may be patterned to define a plurality of fins 510. In particular, fins 510 may be defined by the formation of a photolithographic mask (not shown) over the substrate 130, followed by anisotropic reactive ion etching (RIE) of the substrate 130. Fins 510 may have a width $w_1$ of, e.g., 50-300 Å, and a height $h_1$ of, e.g., 50-500 Å. The photolithographic mask is removed after the RIE step.

Figure 7A:
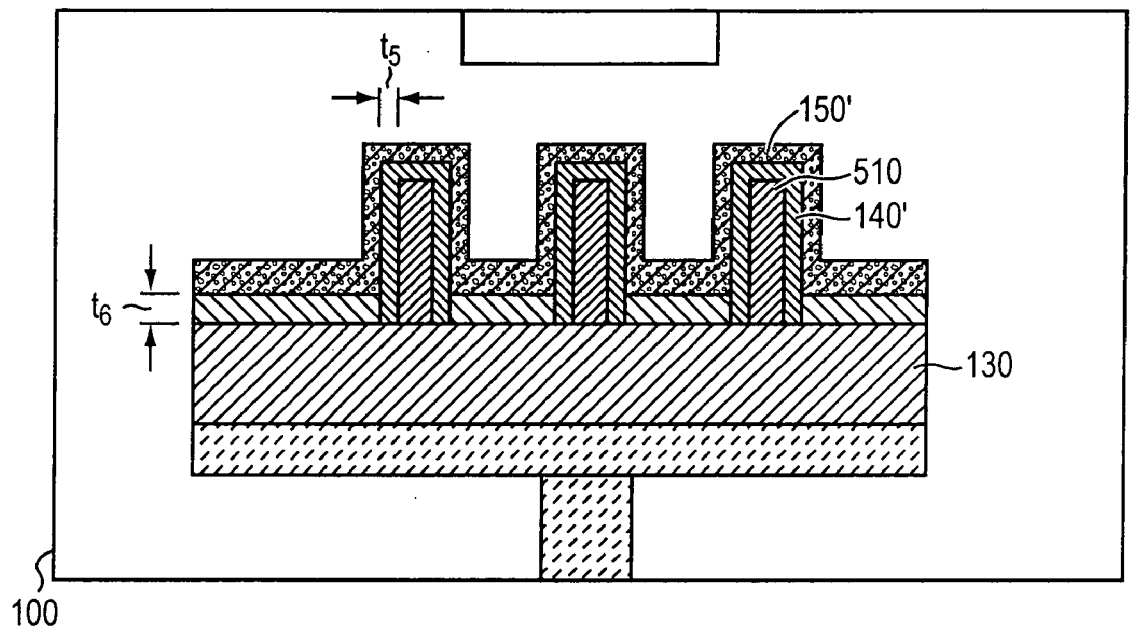
Figure 7B:
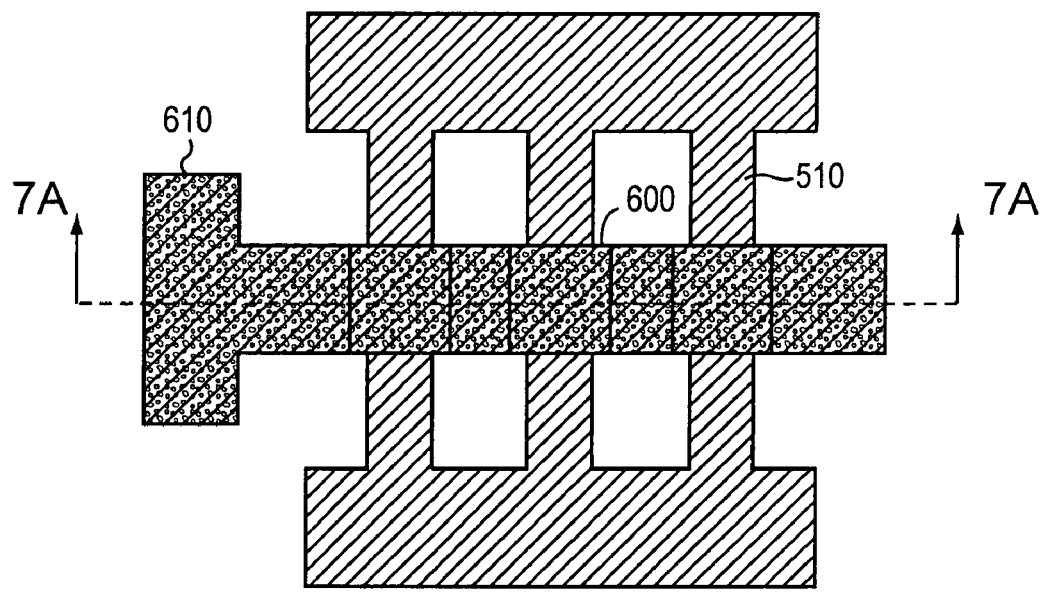

Referring to FIGS. 7A and 7B, the patterned substrate 130 is placed in the processing chamber 100. Dielectric layer 140' is conformally deposited over and between the fins 510, to define a gate dielectric. Dielectric layer 140' is a gate dielectric layer and includes a dielectric material that may include a first metal nitride and/or a metal oxide, as discussed above with reference to FIG. 1. Dielectric layer 140' disposed over the fins has a thickness $t_5$ of, e.g., 10-100 Å. In an embodiment, channel region 400 may be deposited over fins 510 prior to formation of dielectric layer 140' as described above with reference to FIG. 4. In another embodiment, interfacial layer 300 may be formed below dielectric layer 140' as described above with reference to FIG. 4.

After the formation of the dielectric layer 140', electrode layer 150' is subsequently formed in the same processing chamber and without removing the substrate 130 therefrom, to define a gate electrode. The electrode layer 150' is conformally deposited over dielectric layer 140. Electrode layer 150' includes at least one of a metal or a second metal nitride, as discussed above with reference to FIG. 1. Electrode layer 150' has a thickness $t_6$ of, e.g., 100-2000 Å. A photolithographic mask (not shown) is formed over electrode layer 150'. Portions of the electrode layer 150' are selectively removed by, e.g., RIE to define a gate 600 crossing over the fins 510, and terminating in a gate contact area 610. Portions of the dielectric layer 140' are exposed (or even removed) by the RIE of electrode layer 150'. The formation of a finFET may completed by methods known to those of skill in the art.

As noted above, the layers discussed herein may be formed in a cluster tool. For example, the cluster tool may have at least one of the following sub-chambers adapted for the indicated process:
- Sub-chamber 1—ALD or CVD for deposition of channel region 400;
- Sub-chamber 2—ALD for deposition of dielectric layer 140;
- Sub-chamber 3—anneal or oxidation or nitridation or ALD for formation of interfacial layer 300; and/or
- Sub-chamber 4—CVD or ALD for deposition of electrode layer 150.

Dielectric layer 140', electrode layer 150', channel region 400, and interfacial layer 300 may be formed by methods that enable a high degree of uniformity in thickness and composition, e.g., atomic layer deposition, oxidation, or nitridation. Each of these layers may have a highly uniform thickness and composition, as described above, even on non-coplanar surfaces such as the tops and sides of fins 510.

The invention may be embodied in other specific forms without departing from the spirit or essential characteristics thereof. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein.

What is claimed is:

1. A method for forming a semiconductor structure, the method comprising the steps of:
   forming in a processing chamber in a thin-film deposition system a dielectric layer and, by deposition, a channel region over a substrate; and
   subsequently forming, in the same processing chamber and without removing the substrate therefrom, an electrode layer directly over and in contact with the dielectric layer formed over the channel region and the substrate,
   wherein (i) the semiconductor structure comprises the channel region, the dielectric layer, and the electrode layer disposed over the substrate, and (ii) the substrate provides rigid support.

2. The method of claim 1, wherein the dielectric layer is a gate dielectric layer and the electrode layer is a gate electrode layer.

3. The method of claim 2, wherein the gate dielectric layer is formed above the channel region, and the channel region and the gate dielectric layer have at least one element in common.

4. The method of claim 3, wherein the gate dielectric layer and the channel region are each formed by a first deposition technique.

5. The method of claim 4, further comprising defining a transistor over the substrate.

6. The method of claim 1, wherein the dielectric layer is formed by at least one of atomic layer deposition, chemical vapor deposition, molecular beam epitaxy, and sputtering.

7. The method of claim 1, wherein the processing chamber comprises a single-wafer chamber.

8. The method of claim 1, wherein forming the dielectric layer comprises forming at least one of a metal oxide and a metal nitride.

9. The method of claim 1, wherein the electrode layer is formed by at least one of atomic layer deposition, chemical vapor deposition, molecular beam epitaxy, and sputtering.

10. The method of claim 9, wherein the electrode formation method utilizes a second precursor comprising at least one of a metal halide, a metal organometallic compound, a metal, and a metal nitride, and the metal is selected from the group consisting of a group IIIA metal, a transition metal, a rare earth metal, an alkali metal, and an alkaline earth metal.

11. The method of claim 1, wherein the electrode layer comprises at least one of a metal and a metal nitride.

12. The method of claim 1, wherein the dielectric layer and electrode layer are formed by substantially the same formation method.

13. The method of claim 12, wherein the formation method comprises atomic layer deposition.

14. The method of claim 1, wherein the dielectric layer and the electrode layer are formed from substantially the same precursor.

15. The method of claim 1, wherein the dielectric layer and the electrode layer are formed from different precursors.

16. The method of claim 15, wherein the precursors comprise different compositions.

17. The method of claim 15, wherein the precursors comprise different concentrations in an ambient.

18. The method of claim 1, wherein at least a portion of the dielectric layer and at least a portion of the electrode layer are formed at different temperatures.

19. The method of claim 1, wherein the channel region is strained.

20. A method for forming a semiconductor structure, the method comprising the steps of:
   forming in a processing chamber in a thin-film deposition system a dielectric layer over a substrate; and
   subsequently forming, in the same processing chamber and without removing the substrate therefrom, an electrode layer directly over and in contact with the dielectric layer formed over the substrate; and
   defining a transistor over the substrate,
   wherein (i) the dielectric layer is a gate dielectric layer, (ii) the electrode layer is a gate electrode layer, (iii) the gate dielectric layer is formed above a channel region, (iv) the channel region and the gate dielectric layer have at least one element in common, (v) the gate dielectric layer and the channel region are each formed by a first deposition technique, (vi) the channel region is formed in the processing chamber and the semiconductor substrate remains in the processing chamber during the formation of the channel region and the gate dielectric layer, (vii) the transistor comprises a finFET, and (viii) the substrate provides rigid support.

21. A method for forming a semiconductor structure, the method comprising the steps of:
   forming in a processing chamber in a thin-film deposition system a dielectric layer over a substrate by at least one of atomic layer deposition, chemical vapor deposition, molecular beam epitaxy, or sputtering; and
   subsequently forming, in the same processing chamber and without removing the substrate therefrom, an electrode layer directly over and in contact with the dielectric layer formed over the substrate,
   wherein (i) the dielectric formation method utilizes a first precursor comprising at least one of a metal halide, a metal, a metal nitride, or an organometallic compound comprising a metal, (ii)-the metal is selected from the group consisting of a group IIIA metal, a transition metal, a rare earth metal, an alkali metal, and an alkaline earth metal, (iii) the semiconductor structure comprises the dielectric layer and the electrode layer disposed over the substrate, and (iv) the substrate provides rigid support.

22. A method for forming a semiconductor structure, the method comprising:
   forming in a processing chamber in a thin-film deposition system a dielectric layer over a substrate;
   subsequently forming, in the same processing chamber and without removing the substrate therefrom, an electrode layer directly over and in contact with the dielectric layer formed over the substrate; and
   forming an interfacial layer disposed between the dielectric layer and the substrate,
   wherein (i) the step of forming the interfacial layer comprises at least one of deposition, plasma immersion, and annealing, (ii) the semiconductor structure comprises the dielectric layer, the interfacial layer, and the electrode layer disposed over the substrate, and (iii) the substrate provides rigid support.

23. The method of claim 22, wherein the interfacial layer comprises at least one of a group II element, a group III element, a group IV element, a group V element, and a group VI element.

24. The method of claim 23, wherein the interfacial layer comprises at least one of oxygen, nitrogen, silicon, and germanium.

25. The method of claim 22, wherein the dielectric layer and the interfacial layer are formed by the same method.

26. The method of claim 22, wherein the interfacial layer is formed above a channel region, and the channel region and the interfacial layer have at least one element in common.

27. A method for forming a semiconductor structure, the method comprising the steps of:
   forming in a processing chamber in a thin-film deposition system a dielectric layer over a substrate and an interfacial layer disposed between the dielectric layer and the substrate; and
   subsequently forming, in the same processing chamber and without removing the substrate therefrom, an electrode layer directly over and in contact with the dielectric layer,
   wherein (i) the interfacial layer is formed above a channel region, (ii) the interfacial layer comprises a first semiconductor, the channel region comprises a second semiconductor, and the first semiconductor and the second semiconductor are different, (iii) the semiconductor structure comprises the dielectric layer, the interfacial layer, and the electrode layer disposed over the substrate, and (iv) the substrate provides rigid support.

28. The method of claim 27, wherein the first semiconductor comprises a group IV element.

29. The method of claim 28, wherein the first semiconductor comprises silicon.

* * * * *